US011501840B1

(12) United States Patent
Yeung et al.

(10) Patent No.: US 11,501,840 B1
(45) Date of Patent: Nov. 15, 2022

(54) PROXIMITY DISTURB REMEDIATION BASED ON A NUMBER OF PROGRAMMED MEMORY CELLS

(71) Applicant: Micron Technology, Inc., Boise, ID (US)

(72) Inventors: Chun Sum Yeung, San Jose, CA (US); Devin M. Batutis, San Jose, CA (US)

(73) Assignee: MICRON TECHNOLOGY, INC., Boise, ID (US)

( * ) Notice: Subject to any disclaimer, the term of this patent is extended or adjusted under 35 U.S.C. 154(b) by 0 days.

(21) Appl. No.: 17/243,386

(22) Filed: Apr. 28, 2021

(51) Int. Cl.
*G11C 16/34* (2006.01)
*G11C 16/30* (2006.01)
*G11C 16/26* (2006.01)
*G11C 16/08* (2006.01)
*G11C 16/10* (2006.01)

(52) U.S. Cl.
CPC .......... *G11C 16/3427* (2013.01); *G11C 16/08* (2013.01); *G11C 16/102* (2013.01); *G11C 16/26* (2013.01); *G11C 16/30* (2013.01); *G11C 16/3459* (2013.01)

(58) Field of Classification Search
CPC ... G11C 16/3427; G11C 16/08; G11C 16/102; G11C 16/26; G11C 16/30; G11C 16/3459
See application file for complete search history.

(56) References Cited

U.S. PATENT DOCUMENTS 10,839,922 B2* 11/2020 Yang ..................... G11C 16/16
2019/0362798 A1* 11/2019 Yang .................. G06F 11/1048

* cited by examiner

*Primary Examiner* — Jay W. Radke
(74) *Attorney, Agent, or Firm* — Nicholson De Vos Webster & Elliott LLP (57) ABSTRACT

A method is described that includes determining, by a memory subsystem controller of a memory device, a number of memory cells from a set of memory cells that are in a programmed state. The memory subsystem controller further compares the number of memory cells from the set of memory cells that are in the programmed state to a proximity disturb threshold and in response to determining that the number satisfies the proximity disturb threshold, performs a remediation operation on user data stored in the set of memory cells.

20 Claims, 5 Drawing Sheets

DETERMINING, BY A MEMORY SUBSYSTEM CONTROLLER OF A MEMORY DEVICE, A NUMBER OF MEMORY CELLS FROM A SET OF MEMORY CELLS THAT ARE IN A PROGRAMMED STATE
402

COMPARING, BY THE MEMORY SUBSYSTEM CONTROLLER, THE NUMBER OF MEMORY CELLS FROM THE SET OF MEMORY CELLS THAT ARE IN THE PROGRAMMED STATE TO A PROXIMITY DISTURB THRESHOLD
404

IN RESPONSE TO DETERMINING THAT THE NUMBER SATISFIES THE PROXIMITY DISTURB THRESHOLD, PERFORMING, BY THE MEMORY SUBSYSTEM CONTROLLER, A REMEDIATION OPERATION ON USER DATA STORED IN THE SET OF MEMORY CELLS
406

PROXIMITY DISTURB REMEDIATION BASED ON A NUMBER OF PROGRAMMED MEMORY CELLS

TECHNICAL FIELD

The present disclosure generally relates to proximity disturb remediation, and more specifically, relates to proximity disturb remediation based on a number of programmed memory cells.

BACKGROUND ART

A memory subsystem can include one or more memory devices that store data. The memory devices can be, for example, non-volatile memory devices and volatile memory devices. In general, a host system can utilize a memory subsystem to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

Aspects of the present disclosure are directed to proximity disturb remediation based on a number of programmed memory cells in a memory subsystem. A memory subsystem can be a storage device, a memory module, or a hybrid of a storage device and memory module. Examples of storage devices and memory modules are described below in conjunction with FIG. 1. In general, a host system can utilize a memory subsystem that includes one or more components, such as memory devices that store data. The host system can provide data to be stored at the memory subsystem and can request data to be retrieved from the memory subsystem.

A memory device can be a non-volatile memory device. A non-volatile memory device is a package of one or more dice. One example of non-volatile memory devices is a negative-and (NAND) memory device. Other examples of non-volatile memory devices are described below in conjunction with FIG. 1. The dice in the packages can be assigned to one or more channels for communicating with a memory subsystem controller. Each die can consist of one or more planes. Planes can be grouped into logic units (LUN). For some types of non-volatile memory devices (e.g., NAND memory devices), each plane consists of a set of physical blocks, which are groups of memory cells to store data. A cell is an electronic circuit that stores information.

Depending on the cell type, a cell can store one or more bits of binary information, and has various logic states that correlate to the number of bits being stored. The logic states can be represented by binary values, such as "0" and "1", or combinations of such values. There are various types of cells, such as single-level cells (SLCs), multi-level cells (MLCs), triple-level cells (TLCs), and quad-level cells (QLCs). For example, an SLC can store one bit of information and has two logic states.

As semiconductor manufacturing techniques pack memory cells that store data closer and closer together to achieve smaller and/or higher capacity memory products, memory cells have reduced isolation from each other. The reduced isolation increases certain effects. One such effect is disturbance coupling, also referred to as proximity disturb, where accessing one memory cell (i.e., an aggressor memory cell) causes artifacts associated with that access to disturb nearby memory cells (i.e., victim memory cells). For media that use an electric or magnetic process to access the state of a memory cell (e.g., read or write a memory cell), such as disk drives or flash media, magnetic and/or electric effects propagate to surrounding/neighboring memory cells. For media that use a thermal process to access the state of a memory cell, such as phase change media, thermal effects propagate to neighboring memory cells. As the density of memory cells in a memory device increases, proximity disturb effects can cause an access to one aggressor memory cell to disturb the data stored in nearby victim memory cells due to the reduced distance (and therefore isolation) between memory cells. For example, magnetic, electrical, thermal, or similar disturbance effects from repeatedly applying a read voltage to one or more memory cells proximate to a victim memory cell can result in data stored in the victim memory cell to be changed or otherwise lost. Failure to remediate the effects of proximity disturbances can result in data loss beyond the limits of error correction. For example, when a codeword stores user data and parity bits/data, the parity data can be configured to account for up to X bit errors in the user data. In this example, proximity disturb effects that result in more than X bit errors in the user data (e.g., X+1 bit errors) will lead to loss of user data.

Since proximity disturb effects can lead to loss of user data, a memory controller can track potential/estimated or actual proximity disturbances to victim memory cells and remediate these effects. For example, a memory controller can read user data stored in a set of memory cells and determine a bit error rate for the set of memory cells using a set of parity bits stored along with the user data. When the bit error rate exceeds a prescribed threshold, an error corrected version of the user data is either written back to the same location in the memory device (i.e., the same set of memory cells) or a new location in the memory device. Although this technique ensures that proximity disturb effects felt by victim memory cells do not result in lost user data by performing error correction before disturbances result in errors in user data exceeding the capabilities of parity data, this technique requires a considerable amount of overhead. In particular, the above-described technique for managing proximity disturb effects requires user and parity data to be read from the memory device and passed to a memory controller and the memory controller must perform an error correction routine to determine the potential proximity disturb effects on a set of memory cells irrespective of whether remediation is eventually performed (i.e., irrespective of whether the user data is rewritten to the memory device). Moving data from memory devices to the memory controller and performing an error correction routine requires considerable (1) computing resources, (2) power/energy, and (3) time to complete.

Aspects of the present disclosure address the above and other deficiencies by determining a proximity disturb effect on a set of memory cells solely based on a determined number of programmed bits in the set of memory cells. In particular, a single memory cell can represent two or more states. For example, an SLC represents two states (e.g., the logical values 0 and 1) while a TLC represents eight states (e.g., the logical values 000, 001, 010, 011, 100, 101, 110, and 111). Regardless of the configuration of memory cells in a memory device, one of the states of the memory cells corresponds to an erased state while the remaining states are considered programmed states. In the examples given above, logical values corresponding to zero (e.g., 0 for an SLC memory cell and 000 for a TLC memory cell) represent an erased state while the remaining logical values represent programmed states for respective memory cell types. Through the use of scramblers, a memory controller ensures that each state is equally or nearly equally represented in a memory device. Thus, along a word line of a memory device that uses TLCs, there will be an equal (or approximately equal) number of memory cells in each of the eight states (e.g., $\frac{1}{8}$ of the memory cells will have a logical value of 000, $\frac{1}{8}$ of the memory cells will have a logical value of 001, $\frac{1}{8}$ of the memory cells will have a logical value of 010, etc.).

Each of these states of a memory cell correspond to a voltage level or voltage range such that when a read voltage (Vt) is applied to a memory cell, the read voltage is greater than the voltage corresponding to the erased state and less than the voltages corresponding to the programmed states. In this configuration, proximity disturbances can affect the voltage levels of memory cells in all states but will affect memory cells with lower voltage levels the most. In particular, proximity disturbances will affect memory cells in an erased state more than memory cells in programmed states. These disturbances may cause the voltage level of some memory cells that are intended to be in an erased state to increase such that the memory cell is now in a programmed state (i.e., the read voltage is now higher than the voltage of these memory cells that should be in an erased state). With more proximity disturbance effects, the voltage levels of more memory cells, which are intended to be in an erased state, may be increased to now be in a programmed state. However, this unintended movement of memory cells from an erased state to a programmed state will affect the even distribution of memory cells into the set of states capable of being represented by each memory cell. For example, in a memory device that includes TLC memory cells with eight possible states, proximity disturbances can result in less than $\frac{1}{8}$ of the memory cells being in an erased state, as the voltage levels of some of these erased memory cells may be increased to programmed state levels. Accordingly, when the numbers of memory cells in erased and programmed states no longer represents an even distribution, a memory controller can be triggered to take an action to remediate proximity disturb effects. For example, a memory controller can apply a read voltage to a word line of a block of pages. Based on this read voltage, the memory controller determines the number of memory cells in an erased state and/or a number of memory cells in a programmed state. When the number of memory cells in a programmed state is greater than a prescribed ratio/threshold, the memory controller can be triggered to take an action to remediate proximity disturb effects for this set of memory cells (e.g., reading user data and parity data from the block of pages, correcting the user data using the parity data, and writing the corrected user data back to the memory device). In this fashion, the memory controller is not forced to entirely read user and parity data and perform error correction during every check of proximity disturbance errors in the memory device, as instead only a single read voltage is applied to a word line in comparison to fully reading data from multi-level memory cells, which can require multiple read voltages to distinguish between multiple programmed states. Only when proximity disturbances are detected (e.g., the number of memory cells in a programmed state is greater than a prescribed ratio/threshold) are a full read, movement of the data to a memory controller, and error correction performed. By not requiring a full read of data, movement of data to the memory controller, and/or performance of an error correction routine for each proximity disturbance check, considerable reductions can be made in terms of (1) computing resources, (2) power/energy, and (3) time to determined effects from proximity disturbances. Further details of these techniques will be described below.

Figure 1:
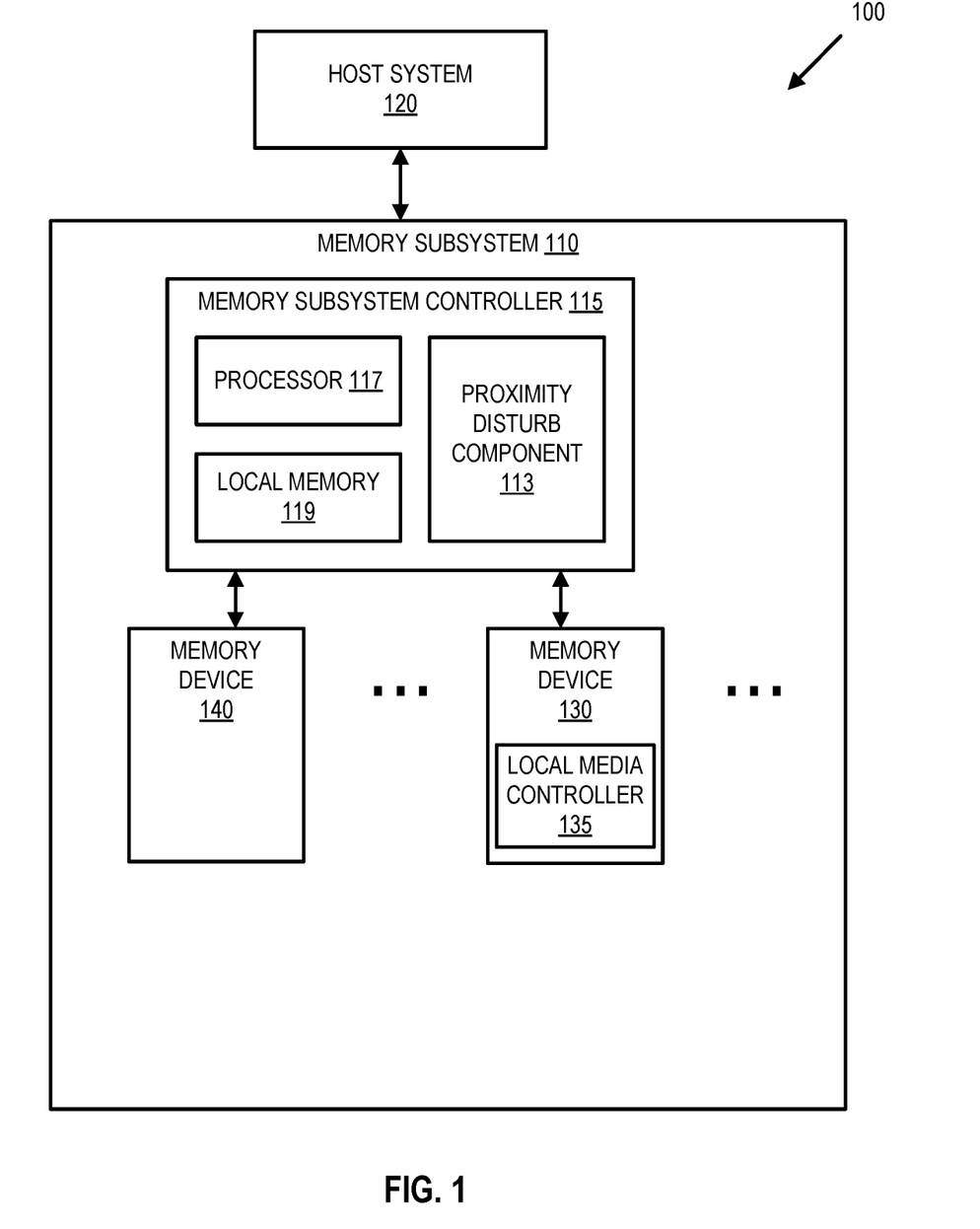
FIG. 1 illustrates an example computing system that includes a memory subsystem in accordance with some embodiments of the present disclosure.

FIG. 1 illustrates an example computing system 100 that includes a memory subsystem 110 in accordance with some embodiments of the present disclosure. The memory subsystem 110 can include media, such as one or more volatile memory devices (e.g., memory device 140), one or more non-volatile memory devices (e.g., memory device 130), or a combination of such.

A memory subsystem 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory subsystems 110. In some embodiments, the host system 120 is coupled to different types of memory subsystems 110. FIG. 1 illustrates one example of a host system 120 coupled to one memory subsystem 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory subsystem 110, for example, to write data to the memory subsystem 110 and read data from the memory subsystem 110.

The host system 120 can be coupled to the memory subsystem 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), Small Computer System Interface (SCSI), a double data rate (DDR) memory bus, a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), or any other interface. The physical host interface can be used to transmit data between the host system 120 and the memory subsystem 110. The host system 120 can further utilize an NVM Express (NVMe) interface to access components (e.g., memory devices 130) when the memory subsystem 110 is coupled with the host system 120 by the PCIe interface. The physical host interface can provide an interface for passing control, address, data, and other signals between the memory subsystem 110 and the host system 120. FIG. 1 illustrates a memory subsystem 110 as an example. In general, the host system 120 can access multiple memory subsystems via a same communication connection, multiple separate communication connections, and/or a combination of communication connections.

The memory devices 130,140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Although non-volatile memory devices such as NAND type memory (e.g., 2D NAND, 3D NAND) and 3D cross-point array of non-volatile memory cells are described, the memory device 130 can be based on any other type of non-volatile memory, such as read-only memory (ROM), phase change memory (PCM), self-selecting memory, other chalcogenide-based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide-based RRAM (OxRAM), negative-or (NOR) flash memory, and electrically erasable programmable read-only memory (EEPROM).

A memory subsystem controller 115 (or controller 115 for simplicity) can communicate with the memory devices 130 to perform operations such as reading data, writing data, or erasing data at the memory devices 130 and other such operations (e.g., in response to commands scheduled on a command bus by controller 115). The memory subsystem controller 115 can include hardware such as one or more integrated circuits and/or discrete components, a buffer memory, or a combination thereof. The hardware can include digital circuitry with dedicated (i.e., hard-coded) logic to perform the operations described herein. The memory subsystem controller 115 can be a microcontroller, special purpose logic circuitry (e.g., a field programmable gate array (FPGA), an application specific integrated circuit (ASIC), etc.), or another suitable processor.

The memory subsystem controller 115 can include a processing device 117 (processor) configured to execute instructions stored in a local memory 119. In the illustrated example, the local memory 119 of the memory subsystem controller 115 includes an embedded memory configured to store instructions for performing various processes, operations, logic flows, and routines that control operation of the memory subsystem 110, including handling communications between the memory subsystem 110 and the host system 120.

In some embodiments, the local memory 119 can include memory registers storing memory pointers, fetched data, etc. The local memory 119 can also include read-only memory (ROM) for storing micro-code. While the example memory subsystem 110 in FIG. 1 has been illustrated as including the memory subsystem controller 115, in another embodiment of the present disclosure, a memory subsystem 110 does not include a memory subsystem controller 115, and can instead rely upon external control (e.g., provided by an external host, or by a processor or controller separate from the memory subsystem 110).

In general, the memory subsystem controller 115 can receive commands or operations from the host system 120 and can convert the commands or operations into instructions or appropriate commands to achieve the desired access to the memory devices 130 and/or the memory device 140. The memory subsystem controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory subsystem controller 115 can further include host interface circuitry to communicate with the host system 120 via the physical host interface. The host interface circuitry can convert the commands received from the host system into command instructions to access the memory devices 130 and/or the memory device 140 as well as convert responses associated with the memory devices 130 and/or the memory device 140 into information for the host system 120.

The memory subsystem 110 can also include additional circuitry or components that are not illustrated. In some embodiments, the memory subsystem 110 can include a cache or buffer (e.g., DRAM) and address circuitry (e.g., a row decoder and a column decoder) that can receive an address from the memory subsystem controller 115 and decode the address to access the memory devices 130.

In some embodiments, the memory devices 130 include local media controllers 135 that operate in conjunction with memory subsystem controller 115 to execute operations on one or more memory cells of the memory devices 130. An external controller (e.g., memory subsystem controller 115)

can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

The memory subsystem 110 includes a proximity disturb component 113 that can determine whether remediation of a block of pages should be performed based on a number of programmed memory cells in the block of pages. In some embodiments, the controller 115 includes at least a portion of the proximity disturb component 113. For example, the controller 115 can include a processor 117 (processing device) configured to execute instructions stored in local memory 119 for performing the operations described herein. In some embodiments, a proximity disturb component 113 is part of the host system 120, an application, or an operating system.

The proximity disturb component 113 can determine whether remediation of a block of pages should be performed based on a number of programmed memory cells in the block of pages. Further details with regards to the operations of the proximity disturb component 113 are described below.

Figure 2:
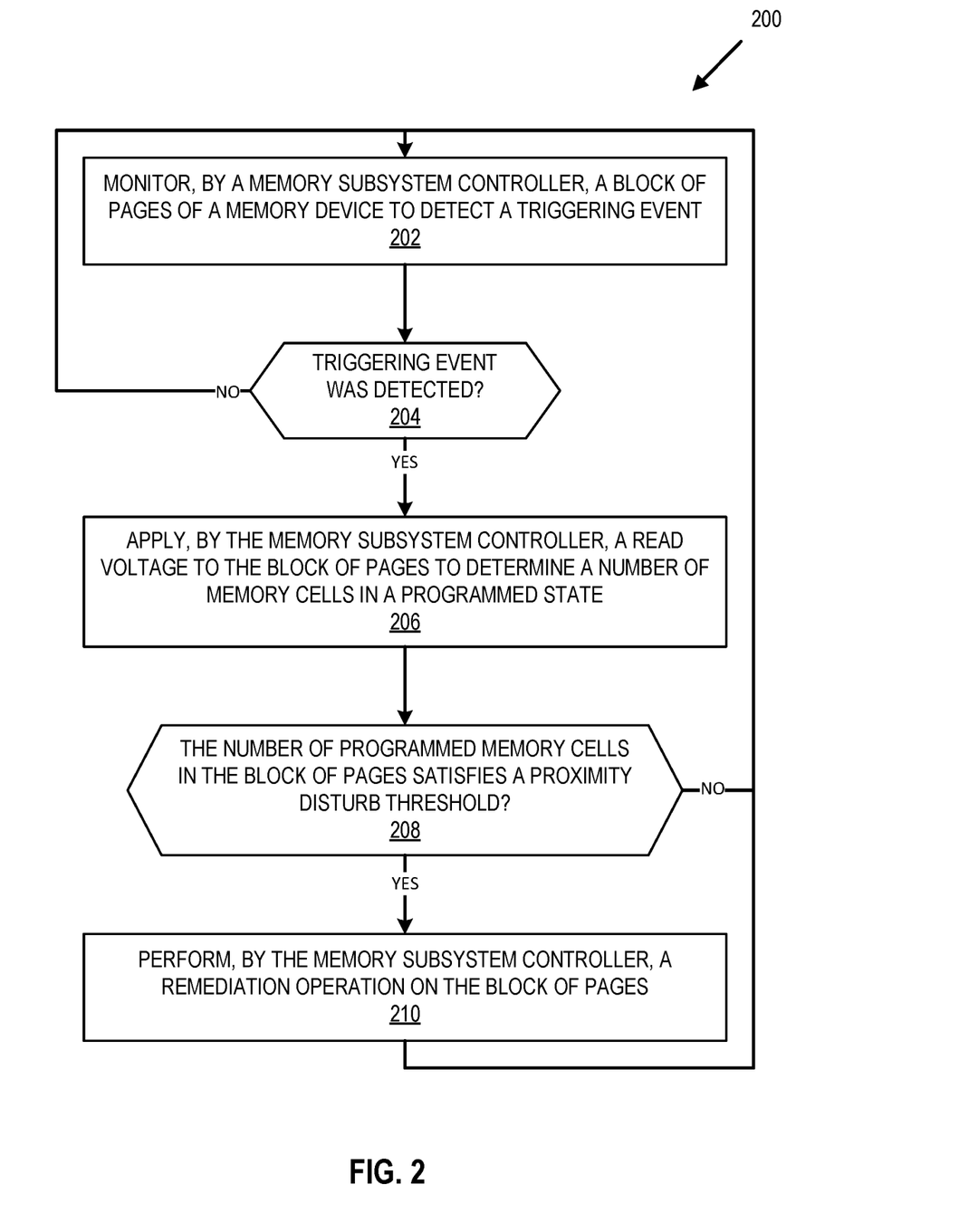
FIG. 2 is a flow diagram of an example method to determine proximity disturb effects to a set of memory cells based on a number of programmed memory cells, in accordance with some embodiments of the present disclosure.

FIG. 2 is a flow diagram of an example method 200 to determine proximity disturb effects to a set of memory cells based on a number of programmed memory cells, in accordance with some embodiments of the present disclosure. The method 200 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 200 is performed by the proximity disturb component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 202, the processing device monitors a block of pages of a memory device (e.g., the memory device 140 or the memory device 130) to detect a triggering event. For example, a triggering event can be the passage of time (e.g., one microsecond, one-hundred microseconds, etc.) or a predetermined number of accesses to the block of pages (e.g., one-hundred reads and/or writes to the block of pages). Although described in relation to a block of pages, in some embodiments, the triggering event and other portions of this method 200 can be performed in relation to other numbers and/or groups of memory cells. As used herein, each page includes a set of memory cells and all the memory cells in a block of pages shares a single word line. In one embodiment, the memory subsystem controller 115 can use the shared word line to apply a read voltage to each memory cell in the block of pages. In this fashion, the memory subsystem controller 115 can determine the number of memory cells/bits in the block of pages have a voltage below the read voltage and how many memory cells have a voltage above the read voltage. In some embodiments, the memory subsystem controller 115 can use additional read voltages to distinguish between programmed states when a full read of the set of memory cells is performed.

At operation 204, upon the processing device detecting that a triggering event was not detected, the method 200 returns to operation 202 to continue monitoring the block of pages to detect a triggering event. Conversely, upon the processing device detecting that a triggering event was detected, the method 200 moves to operation 206.

At operation 206, the processing device applies a read voltage to the block of pages to determine a number of memory cells/bits that are in a programmed state. For example, the processing device can apply a read voltage (Vt) to a word line that is shared by all the memory cells in the block of pages. In one embodiment, each of the memory cells in the block of pages can be configured to represent one of a plurality of states. For example, an SLC can represent two states (e.g., the logical values 0 and 1) while a TLC can represent eight states (e.g., the logical values 000, 001, 010, 011, 100, 101, 110, and 111). Each of these states of a memory cell correspond to a voltage level or voltage range such that when the read voltage (Vt) is applied to a memory cell, the read voltage is greater than the voltage corresponding to an erased state and less than the voltages corresponding to programmed states.

Although described in relation to SLC and TLC memory cells, the method 200 can be performed in relation to any type of memory cells, including MLCs and QLCs. Accordingly, the use of SLC and TLC memory cells is for illustrative purposes and other types of memory cells can be used.

Further, although described in relation to determining the number of memory cells/bits that are in a programmed state, the method 200 can be similarly performed by determining the number of memory cells/bits that are in an erased state.

At operation 208, the processing device determines whether the number of programmed memory cells satisfies a proximity disturb threshold. In particular, as mentioned above, a memory controller can utilize various techniques, including those that employ scramblers, to ensure that memory cells in a block of pages have an equal (or approximately equal) distribution of each possible state. For example, for a TLC-based memory device, the memory controller can ensure that ⅛ of the memory cells will be programmed to have a logical value of 000, ⅛ of the memory cells will be programmed to have a logical value of 001, ⅛ of the memory cells will be programmed to have a logical value of 010, etc. Accordingly, since only one of the states of a TLC corresponds to an erased state while the remaining seven states correspond to the programmed states, ⅛ of the memory cells in the block of pages should be in an erased state and ⅞ of the memory cells in the block of pages should be in a programmed state. However, proximity disturb effects may alter states of memory cells and corresponding ratios, which is particularly notable amongst memory cells in the erased state. Namely, since an erased state is at a lower voltage than programmed states, the memory cells in an erased state will be more susceptible to proximity disturb effects that cause their voltage to increase past the read voltage (i.e., causing these memory cells that should be in an erased state to be read as programmed). In one embodiment, the proximity disturb threshold can be set to represent the number of memory cells in a block of pages that should be in a programmed state to maintain an equal ratio of states in a block of pages. For example, for a set of 48,000 TLC memory cells on a word line (i.e., a set of memory cells that can each represent eight states), 6,000 memory cells should be in an erased state while the remaining 42,000 memory cells should be in one of seven programmed states. In this example, the proximity disturb threshold can be set to 42,000 memory cells/bits such that when the voltage of even one erased memory cell unintentionally moves to a programmed state, the processing device determines that the proximity disturb threshold has been met (i.e., the number of programmed cells is greater than the proximity disturb threshold). In another example, the proximity disturb threshold can account for some level of disturbance. For instance, in the example above, the proximity disturb threshold can be set to 42,000+Y, where Y is greater than or equal to one. In this case, the value Y represents an amount of disturbance padding that is permitted before the proximity disturb threshold is considered satisfied (i.e., a certain number of memory cells (i.e., Y memory cells) can be unintentionally moved from an erased state to a programmed state before the proximity disturb threshold is considered satisfied).

In response to determining that the number of programmed memory cells does not satisfy the proximity disturb threshold, the method 200 can return to operation 202. Conversely, in response to determining that the number of programmed memory cells does satisfy the proximity disturb threshold, the method 200 moves to operation 210.

At operation 210, the processing device performs remediation on the block of pages. For example, the processing device can read user data and parity data from the block of pages and perform a set of error correction operations on the user data based on the parity data to correct for any bit errors. The bit errors may have been introduced to the user data from proximity disturb effects or other causes. In some embodiments, the processing device can use multiple read voltages, including the read voltage (Vt) used at operation 206, to read the user data and parity data from the block of pages. The processing device writes the corrected user data (i.e., the output from the error correction operations) and corresponding parity data to either the same block of pages or a new block of pages in the memory device at operation 210. Accordingly, any bit errors introduced to the user data have now been corrected.

Figure 3:
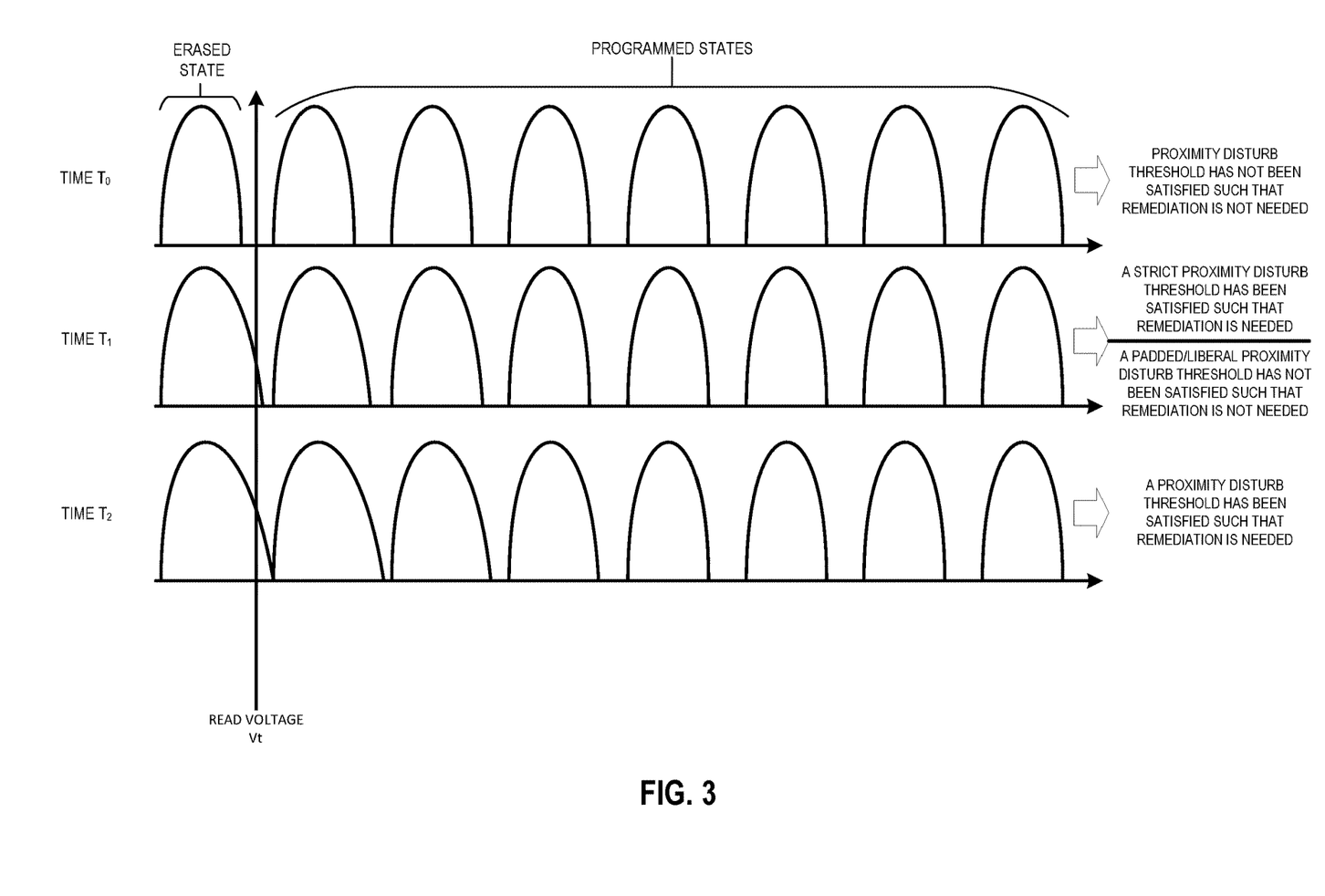
FIG. 3 shows voltage and state distribution of a set of memory cells over time, in accordance another embodiment of the present disclosure.

FIG. 3 shows state and voltage distribution for a set of memory cells in a block of pages over time. In FIG. 3, numbers of memory cells are represented in the vertical axis (i.e., the Y-axis) that are detected in a block of pages at particular voltages, which is represented in the horizontal axis (i.e., X-axis) over three discrete times. In particular, at time $T_0$, the TLC memory cells represented by this distribution of FIG. 3 are evenly spread across the eight possible states of the memory cells (e.g., one erased state and seven programmed states). Accordingly, a read voltage (Vt) applied to these memory cells will indicate that ⅞ of the memory cells are in a programmed state. Based on this determination, the processing device will determine that the proximity disturb threshold has not been satisfied and remediation of the block of pages is not needed. Namely, since no erased memory cells from the block of pages have had their voltages increased past the read voltage, remediation of the block of pages is not needed.

At time $T_1$, proximity disturbance effects have altered the voltage of some memory cells in the block of pages, including some erased memory cells. As shown in FIG. 3, the voltage of some of these erased memory cells have moved past the read voltage. Thus, these memory cells, which should be read as erased to properly represent user or parity data, will now be read as programmed. In some embodiments where the proximity disturb threshold enforces a strict ratio of states amongst memory cells in a block of pages, the processing device can determine that the proximity disturb threshold has been satisfied (e.g., the number of programmed memory cells in the block of pages is greater than the proximity disturb threshold) such that remediation of the block of pages is needed. However, in other embodiments where the proximity disturb threshold enforces a less strict ratio of states amongst memory cells in a block of pages (e.g., a padding value is used to accommodate some changes of erased memory cells to a programmed state), the processing device can determine that the proximity disturb threshold has not been satisfied (e.g., the number of programmed memory cells in the block of pages is less than or equal to the proximity disturb threshold) such that remediation of the block of pages is not needed.

At time $T_2$, proximity disturbance effects have altered the voltage of even more memory cells, including some additional erased memory cells. As shown in FIG. 3, the voltages of even more erased memory cells have moved past the read voltage (in comparison to time $T_1$). In this case, the processing device can determine that the number of programmed memory cells has satisfied the proximity disturb threshold (both a strict and a less strict/padded threshold) such that remediation of the block of pages is needed.

Figure 4:
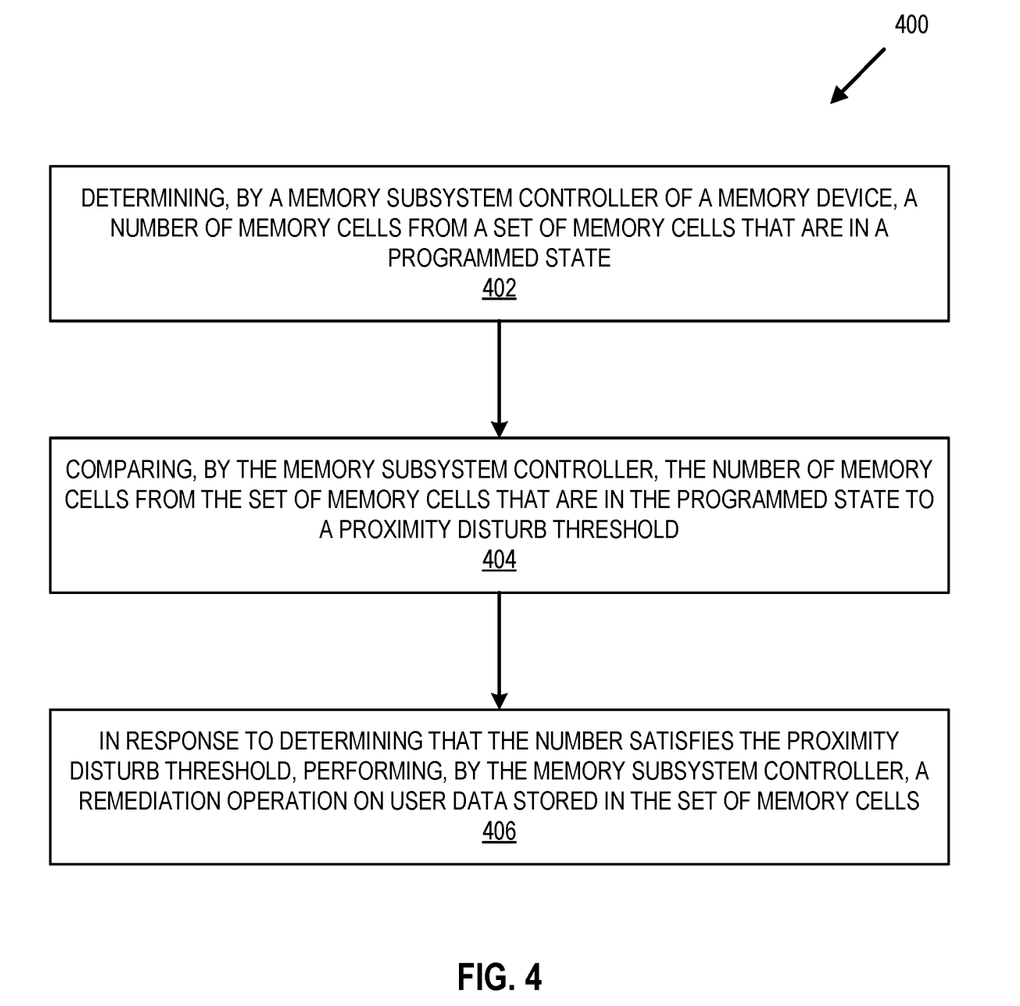
FIG. 4 is a flow diagram of an example method to determine proximity disturb effects to a set of memory cells based on a number of programmed memory cells, in accordance another embodiment of the present disclosure.

FIG. 4 is a flow diagram of an example method 400 to determine proximity disturb effects to a set of memory cells based on a number of programmed memory cells, in accordance with another embodiment of the present disclosure. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by the proximity disturb component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 402, the processing device (e.g., the memory subsystem controller 115) determines a number of memory cells from a set of memory cells that are in a programmed state. In particular, each of the memory cells in the set of memory cells can represent one or more states that each correspond to a voltage or a voltage range. For example, the set of memory cells can be SLCs that can represent a single erased state and a single programmed state. In this configuration, the erased state corresponds to an erased voltage or erased voltage range, such that a memory cell is in the erased state when it has a voltage equal to the erased voltage or within the erased voltage range, and the programmed state corresponds to a programmed voltage or programmed voltage range, such that a memory cell is in the programmed state when it has a voltage equal to the programmed voltage or within the programmed voltage range. Similarly, the set of memory cells can be MLCs that can represent a single erased state and two or more programmed states. In this configuration, the erased state corresponds to an erased voltage or erased voltage range, such that a memory cell is in the erased state when it has a voltage equal to the erased voltage or within the erased voltage range, and the two or more programmed states correspond to separate programmed voltages or programmed voltage ranges, such that a memory cell is in one of the programmed states when it has a voltage equal to a particular programmed voltage or within a particular programmed voltage range.

At operation 404, the processing device compares the number of memory cells from the set of memory cells that are in the programmed state to a proximity disturb threshold. As noted above, a memory subsystem controller 115 seeks to ensure that the states of a memory device are evenly/equally represented by memory cells within a memory device. The proximity disturb threshold can be set to determine whether this distribution of states is being maintained within the set of memory cells. Namely, for a set of 145,792 TLC memory cells along a word line, ⅞ of the memory cells (i.e., 127,568 memory cells) should be in a programmed state since seven of the eight states that the TLC memory cells can represent are programmed states. Accordingly, the proximity disturb threshold can be set to 127,568. Namely, the processing device is seeking to determine whether the number of programmed memory cells is greater than the number of memory cells that should be programmed amongst the set of 145,792 TLC memory cells. When there are more than 127,568 programmed memory cells, this could indicate that some memory cells have increased voltage and changed state as a result of a proximity disturbance.

At operation 406, the processing device performs a remediation operation on user data stored in the set of memory cells in response to determining that the number of programmed memory cells in the set of memory cells satisfies the proximity disturb threshold. For example, the processing device can read user data and parity data from the set of memory cells and perform a set of error correction operations on the user data based on the parity data to correct for any bit errors. The bit errors may have been introduced to the user data from proximity disturb effects or other causes. The processing device writes the corrected user data (i.e., the output from the error correction operations) and corresponding parity data to either the same set of memory cells or a new set of memory cells in the memory device. Accordingly, any bit errors introduced to the user data have now been corrected.

Figure 5:
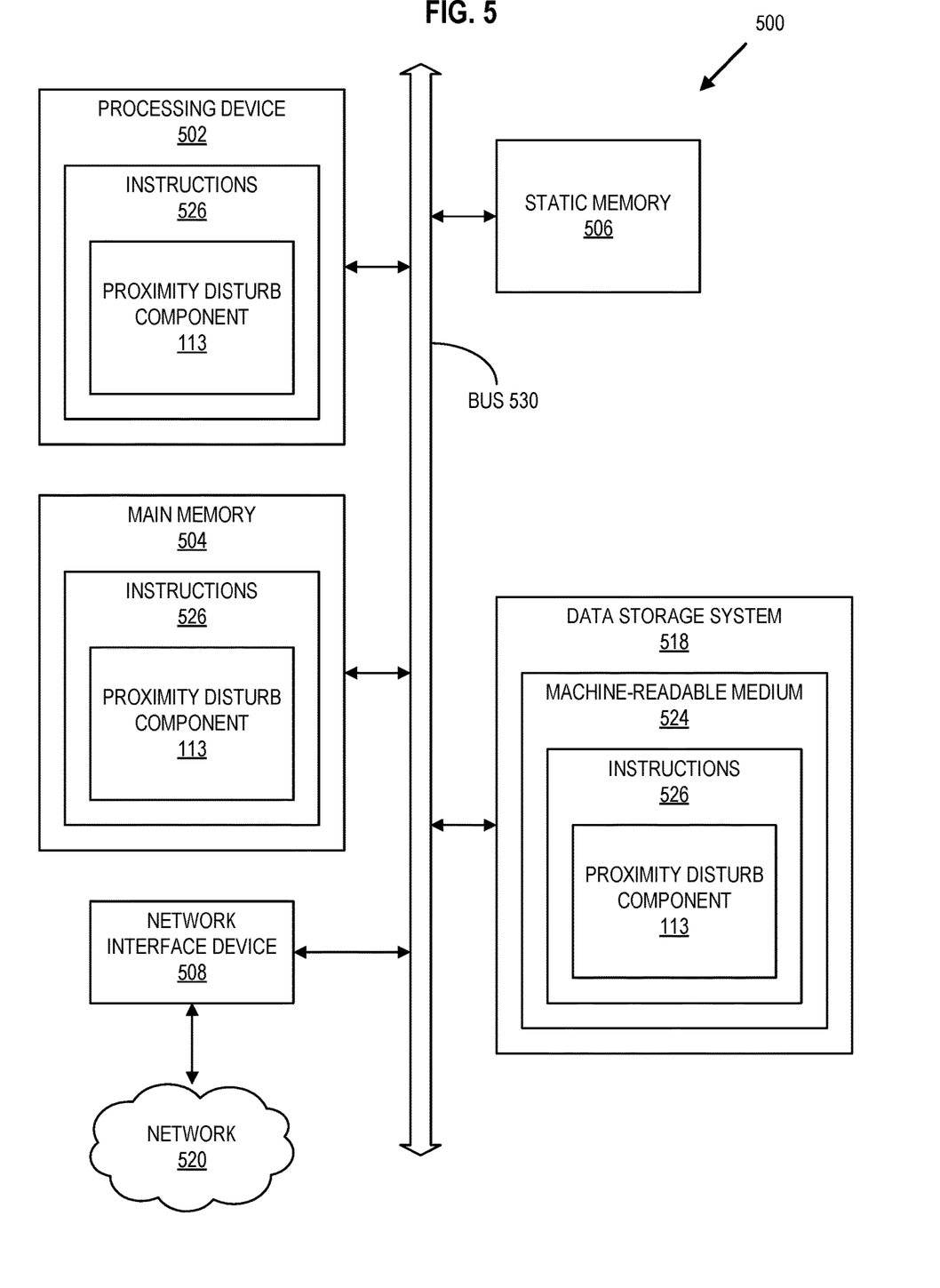
FIG. 5 is a block diagram of an example computer system in which embodiments of the present disclosure may operate.

FIG. 5 illustrates an example machine of a computer system 500 within which a set of instructions, for causing the machine to perform any one or more of the methodologies discussed herein, can be executed. In some embodiments, the computer system 500 can correspond to a host system (e.g., the host system 120 of FIG. 1) that includes, is coupled to, or utilizes a memory subsystem (e.g., the memory subsystem 110 of FIG. 1) or can be used to perform the operations of a controller (e.g., to execute an operating system to perform operations corresponding to the proximity disturb component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 500 includes a processing device 502, a main memory 504 (e.g., read-only memory (ROM), flash memory, dynamic random access memory (DRAM) such as synchronous DRAM (SDRAM) or Rambus DRAM (RDRAM), etc.), a static memory 506 (e.g., flash memory, static random access memory (SRAM), etc.), and a data storage system 518, which communicate with each other via a bus 530.

Processing device 502 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 502 can also be one or more special-purpose processing devices such as an application specific integrated circuit (ASIC), a field programmable gate array (FPGA), a digital signal processor (DSP), network processor, or the like. The processing device 502 is configured to execute instructions 526 for performing the operations and steps discussed herein. The computer system 500 can further include a network interface device 508 to communicate over the network 520.

The data storage system 518 can include a machine-readable storage medium 524 (also known as a computer-readable medium) on which is stored one or more sets of instructions 526 or software embodying any one or more of the methodologies or functions described herein. The instructions 526 can also reside, completely or at least partially, within the main memory 504 and/or within the processing device 502 during execution thereof by the computer system 500, the main memory 504 and the processing device 502 also constituting machine-readable storage media. The machine-readable storage medium 524, data storage system 518, and/or main memory 504 can correspond to the memory subsystem 110 of FIG. 1.

In one embodiment, the instructions 526 include instructions to implement functionality corresponding to a proximity disturb component (e.g., the proximity disturb component 113 of FIG. 1). While the machine-readable storage medium 524 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general-purpose computer selectively activated or reconfigured by a computer program stored in the computer. For example, a computer system or other data processing system, such as the controller 115, may carry out the computer-implemented methods 200 and 400 in response to its processor executing a computer program (e.g., a sequence of instructions) contained in a memory or other non-transitory machine-readable storage medium. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general-purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method comprising:
   determining, by a memory subsystem controller of a memory device, a number of memory cells from a set of memory cells that are in a programmed state of a plurality of states;
   comparing, by the memory subsystem controller, the number of memory cells from the set of memory cells that are in the programmed state to a proximity disturb threshold, wherein the proximity disturb threshold is set to determine if the set of memory cells are evenly distributed amongst the plurality of states; and
   in response to determining that the number satisfies the proximity disturb threshold, performing, by the memory subsystem controller, a remediation operation on user data stored in the set of memory cells.

2. The method of claim 1, wherein the plurality of states include an erased state and the programmed state.

3. The method of claim 2, wherein the set of memory cells are multi-level cells that have a single erased state and a plurality of programmed states.

4. The method of claim 1, wherein the set of memory cells share a word line in the memory device.

5. The method of claim 4, wherein the determining the number of memory cells from the set of memory cells that are in the programmed state is performed by applying a read voltage on the word line of the set of memory cells to determine a number of memory cells from the set of memory cells that have a voltage level that is above the read voltage and a number of memory cells from the set of memory cells that have a voltage level that is below the read voltage.

6. The method of claim 5, wherein the number of memory cells from the set of memory cells that have a voltage level that is above the read voltage is the number of memory cells from the set of memory cells that are in the programmed state.

7. The method of claim 1, wherein the remediation operation includes:
   reading the user data and parity data from the set of memory cells;
   performing an error correction operation on the user data based on the parity data to generate corrected user data; and
   writing the corrected user data to the memory device.

8. A non-transitory computer-readable storage medium comprising instructions that, when executed by a processing device, cause the processing device to:
   determine a number of memory cells from a set of memory cells in a memory device that are in a programmed state of a plurality of states;
   compare the number of memory cells from the set of memory cells that are in the programmed state to a proximity disturb threshold, wherein the proximity disturb threshold is set to determine if the set of memory cells are evenly distributed amongst the plurality of states; and
   in response to determining that the number satisfies the proximity disturb threshold, perform a remediation operation on user data stored in the set of memory cells.

9. The non-transitory computer-readable storage medium of claim 8, wherein the plurality of states include an erased state and the programmed state.

10. The non-transitory computer-readable storage medium of claim 9, wherein the set of memory cells are multi-level cells that have a single erased state and a plurality of programmed states.

11. The non-transitory computer-readable storage medium of claim 8, wherein the set of memory cells share a word line in the memory device.

12. The non-transitory computer-readable storage medium of claim 11, wherein the determining the number of memory cells from the set of memory cells that are in the programmed state is performed by applying a read voltage on the word line of the set of memory cells to determine a number of memory cells from the set of memory cells that have a voltage level that is above the read voltage and a number of memory cells from the set of memory cells that have a voltage level that is below the read voltage.

13. The non-transitory computer-readable storage medium of claim 12, wherein the number of memory cells from the set of memory cells that have a voltage level that is above the read voltage is the number of memory cells from the set of memory cells that are in the programmed state.

14. The non-transitory computer-readable storage medium of claim 8, wherein the processing device is further caused to:
   read the user data and parity data from the set of memory cells;
   perform an error correction operation on the user data based on the parity data to generate corrected user data; and
   write the corrected user data to the memory device.

15. A system comprising:
   a memory device; and
   a processing device, operatively coupled with the memory device, configured to:
      determine a number of memory cells from a set of memory cells in the memory device that are in a programmed state of a plurality of states, wherein the set of memory cells share a word line in the memory device;
      compare the number of memory cells from the set of memory cells that are in the programmed state to a proximity disturb threshold, wherein the proximity disturb threshold is set to determine if the set of memory cells are evenly distributed amongst the plurality of states; and
      in response to determining that the number satisfies the proximity disturb threshold, perform a remediation operation on user data stored in the set of memory cells.

16. The system of claim 15, wherein plurality of states include an erased state and the programmed state.

17. The system of claim 16, wherein the set of memory cells are multi-level cells that have a single erased state and a plurality of programmed states.

18. The system of claim 15, wherein the determining the number of memory cells from the set of memory cells that are in the programmed state is performed by applying a read voltage on the word line of the set of memory cells to determine a number of memory cells from the set of memory cells that have a voltage level that is above the read voltage and a number of memory cells from the set of memory cells that have a voltage level that is below the read voltage.

19. The system of claim 18, wherein the number of memory cells from the set of memory cells that have a voltage level that is above the read voltage is the number of memory cells from the set of memory cells that are in the programmed state.

20. The system of claim 15, wherein the processing device is further to:
   read the user data and parity data from the set of memory cells;
   perform an error correction operation on the user data based on the parity data to generate corrected user data; and
   write the corrected user data to the memory device.

* * * * *